United States Patent
Rigazio

[19]

[11] Patent Number: 5,952,865
[45] Date of Patent: Sep. 14, 1999

[54] VOLTAGE TRANSLATOR CIRCUIT

[75] Inventor: Luca Rigazio, Cigliano, Italy

[73] Assignee: STMicroelectronics, S.R.L., Agrate Brianza, Italy

[21] Appl. No.: 08/798,292

[22] Filed: Feb. 7, 1997

[30] Foreign Application Priority Data

Feb. 12, 1996 [EP] European Pat. Off. .............. 96830058

[51] Int. Cl.[6] ...................................................... H03L 5/00
[52] U.S. Cl. .......................... 327/333; 327/108; 327/437;
326/63; 326/81; 326/83
[58] Field of Search .................................... 327/108, 333,
327/319, 436, 437, 162, 80, 81; 326/62,
63, 68, 80, 81, 73, 74, 83

[56] References Cited

U.S. PATENT DOCUMENTS

| | | | |
|---|---|---|---|
| 4,532,436 | 7/1985 | Bismarck | 327/208 |
| 5,196,737 | 3/1993 | Olmstead | 327/208 |
| 5,243,236 | 9/1993 | McDaniel | 326/68 |
| 5,559,996 | 9/1996 | Fujioka | 395/500 |
| 5,587,676 | 12/1996 | Chowdhury | 327/108 |
| 5,736,869 | 4/1998 | Wei | 326/83 |

FOREIGN PATENT DOCUMENTS

| | | |
|---|---|---|
| 0 377 217 A2 | 7/1990 | European Pat. Off. . |
| 358204617 | 11/1983 | Japan ..................................... 327/333 |

*Primary Examiner*—Kenneth B. Wells
*Assistant Examiner*—Hai L. Nguyen
*Attorney, Agent, or Firm*—David V. Carlson; E. Russell Tarleton; Seed and Berry LLP

[57] ABSTRACT

The circuit is for translating a switching signal disposed between ground level and Vdd to a translated switching signal disposed between first and second voltages Vhsrc and Vhstrap. The circuit includes a bistable circuit formed by two branches which include two nMOS transistors the sources of which are connected to ground and are controlled, respectively, by a switching-on signal and by a switching-off signal derived from the switching signal by means of a buffer and an inverter, respectively. Two pMOS transistors having their sources at the voltage Vhstrap and the drain of one connected to the gate of the other output the translated switching signal at one of their drains. Two further pMOS transistors having gates at the first voltage Vhsrc are interposed between the two nMOS transistors and the two pMOS transistors.

17 Claims, 7 Drawing Sheets

VOLTAGE TRANSLATOR CIRCUIT

TECHNICAL FIELD

The present invention relates to a voltage translator circuit usable in particular in a switching system.

BACKGROUND OF THE INVENTION

In some switching systems (or controlled-switching systems), for example in "step-down" switching regulators such as that shown in FIG. 1, there is an electronic switch which requires a driver device having a supply terminal connected to a terminal of the switch.

As shown in FIG. 1, the switching system 100 comprises an N-channel MOS transistor (nMOS) 105 as an electronic switch. The transistor 105 is connected in the circuit shown by means of two terminals thereof, that is, its source and drain terminals, so as alternately to open and to close the connection between two branches of the circuit connected to these terminals. The transistor 105 is connected, by means of its drain, to a voltage supply indicated as the input voltage Vin (relative to ground). If this switch is opened and closed alternately, that is, if the transistor 105 is cut off and made conductive alternately, a series of voltage pulses of amplitude Vin, having a mean value depending upon the duration of the intervals in which it is switched on and off is produced at the source of the transistor 105. A voltage Vout (relative to earth) is applied to a load 125 by means of a diode 110 and a filter constituted by an inductance 115 and a capacitor 120 (used to reduce the residual alternating component of the voltage at the source of the transistor 105). If the switching frequency of the transistor 105 is high enough, the load 125 is supplied with a direct-current voltage of a value equal to the mean value of the voltage at the source of the transistor 105.

The transistor 105 is controlled by a driving device (or driver 130) supplied by a suitable voltage supply produced, in the example shown, by means of a "bootstrap" circuit which uses a capacitor 135 connected by means of a diode 140 to a supply terminal Vcc. The supply terminals of the driver 130 which are connected to the terminals of the capacitor 135, are indicated Vhstrap and Vhsrc. The terminal Vhsrc is also connected to the source of the transistor 105.

The switching system 100 receives a logic input switching signal (Ldrive) which can assume two levels, one being a high or on level and the other a low or off level; the logic switching signal (Ldrive) is applied to the system 100 by means of a driver 145 supplied by a further voltage supply Vdd. For example, the switching-on signal is equal to the value Vdd of the supply voltage, and the switching-off signal is equal to a zero voltage (0V), that is, to ground potential level.

A translator circuit 150 is interposed between the driver 145 (supplied between Vdd and ground) and the driver 130 (supplied between Vhstrap and Vhsrc). This circuit 150 enables the logic switching signal Ldrive to be translated from a value between 0 and Vdd (for example 5V) to a value between Vhsrc and Vhstrap, where Vhstrap-Vhsrc is constant (for example 5V or 12V) but Vhsrc is variable with time. In the example shown in the drawing, Vhsrc varies from a value of 0V when the switch 105 is open to a value of Vin when the switch 105 is closed; it should be noted that, in certain cases, the voltage Vhsrc may even assume very high values of the order of some tens or hundreds of volts.

Some switching systems comprising various voltage translator devices known in the art are shown in FIGS. 2a–2c. With reference, in particular, to FIG. 2a, a simple voltage translator circuit which uses a Zener diode 205 connected between the supply terminal Vhstrap and the input of the driver 130 is shown. A resistor 210 which does not have a high value, is connected in parallel with the Zener diode 205 to prevent the switch from switching off too slowly. This translator circuit has a high consumption since, in the switching-on stage, the currents are quite high (of the order of a few hundreds of $\mu$A up to a few mA).

To prevent this problem, as shown in FIG. 2b, it has been proposed to replace the resistor in parallel with the Zener diode 205 with a current generator 215 which is switched off during the switching-on stage. The switching-on current (Ion) and the switching-off current (Ioff) can thus be reduced to a few tens of $\mu$A when switching has taken place without the logic state of the switch being lost. This circuit nevertheless also has a consumption in the switching-off stage since the switching-off current (Ioff) cannot be zero.

A different known solution which has a static consumption theoretically of zero and is used particularly when the voltage Vhsrc of the switch terminal reaches high values (tens or hundreds of V) is constituted by the circuit shown in FIG. 2c in which the driver signal is stored in a memory element 220 comprising, for example, a "latch" SR 225. The switching-on and switching-off currents (Ion and Ioff) in this case serve solely for switching the memory element 220 and are therefore pulsed currents with a duration of a few hundreds of ns up to 1 $\mu$s. The signal is translated by means of current pulses generated as a result of a transition of the switching signal. In particular, a switching-on pulse is generated by the block 250 upon the transition of the switching signal from off to on whereas a switching-off pulse is generated by the block 255 upon the transition of the switching signal from on to off.

This translation circuit which is known in the art has some disadvantages. In order to ensure the correct state of the latch 225 after the start-up stage, the circuit described above in fact requires the latch 225 to be connected to a very high resistance 230 which can orient the latch 220 correctly during the rise of the supply voltage of the driver; in practice, however, this resistance 230 cannot have excessively high values, thus producing a current consumption which can bring about discharge of the bootstrap capacitance.

A further problem of the circuit of FIG. 2c is due to the fact that it cannot ensure congruence between the logic switching signals Ldrive and their translated values since the translation takes place by means of pulses generated in relation to a transition of the switching signal Ldrive and not in relation to its logic value. In fact, it is possible for a current pulse not to succeed in switching the memory element of the circuit, for example, by virtue of interference of short duration. In this case, the switch retains its previous state (open or closed) conflicting with the value of the switching signal Ldrive applied. For example, if the switching signal Ldrive changes from off to on, it generates a current switching-on pulse; if this pulse does not succeed in switching the switch, it will remain closed throughout the duration of the switching-on signal. The next transition of the switching signal from on to off will have no effect on the switch, simply confirming its already switched-off state. The switch will thus switch on only upon the subsequent transition of the switching signal from off to on. This problem is particularly serious in the case of a switching-off signal; if the switch is closed and the translator circuit does not succeed in storing the switching-off pulse, the switch remains closed with serious risks of damage to the components of the circuit.

SUMMARY OF THE INVENTION

The present invention provides a circuit for translating a switching signal Ldrive disposed between a first voltage level 0V and a second voltage level Vdd to a corresponding translated switching signal disposed between a third voltage level Vhsrc and a fourth voltage level Vhstrap, the circuit comprising a first terminal 0V, a second terminal Vdd, a third terminal Vhsrc and a fourth terminal Vhstrap for supplying voltages at the first, second, third and fourth levels, driver means connected to the first and second supply terminals 0V, Vdd in order to derive, from the switching signal Ldrive applied to an input terminal of the driver means, a switching-on signal and a switching-off signal at a first output terminal and at a second output terminal, respectively, a bistable circuit connected to the first, third and fourth supply terminals. The circuit further comprises a first branch and a second branch, the branches comprising, respectively, a first transistor and a second transistor of a first type, each having a first terminal connected to the first supply terminal, a second terminal and a control terminal connected, respectively, to the first and second output terminals of the driver means. The bistable circuit is able to produce the translated switching signal at at least one output terminal thereof. The first and second branches comprise, respectively, a third transistor and a fourth transistor of a second type complementary to the first type and each having a first terminal, a second terminal and a control terminal. The first terminals of both transistors are connected to the fourth supply terminal. The second terminal of each transistor is connected to the control terminal of the other. A fifth transistor and a sixth transistor of the second type are connected between the respective second terminals of the first and second transistors and the respective second terminals of the third and fourth transistors. Each of the fifth and sixth transistors has its control terminal connected to the third supply terminal. The second terminal of the third or fourth transistor forms the said at least one output terminal of the bistable circuit.

The solution according to the present invention has a static consumption that is, upon completion of the switching, practically zero, since it has no active low-impedance path between the Vhstrap terminal and ground. This advantage is particularly important in the case of applications in which it is necessary to reduce current consumption to the minimum.

Moreover, this circuit can enable congruence between the input logic signal and the translated output signal to be maintained even in the presence of interference, since the translation takes place in relation to the switching signal and not only to its leading or trailing edge.

BRIEF DESCRIPTION OF THE DRAWINGS

Various embodiments of the present invention will now be described by way of example with reference to the appended drawings.

DETAILED DESCRIPTION OF THE INVENTION

Figure 1:
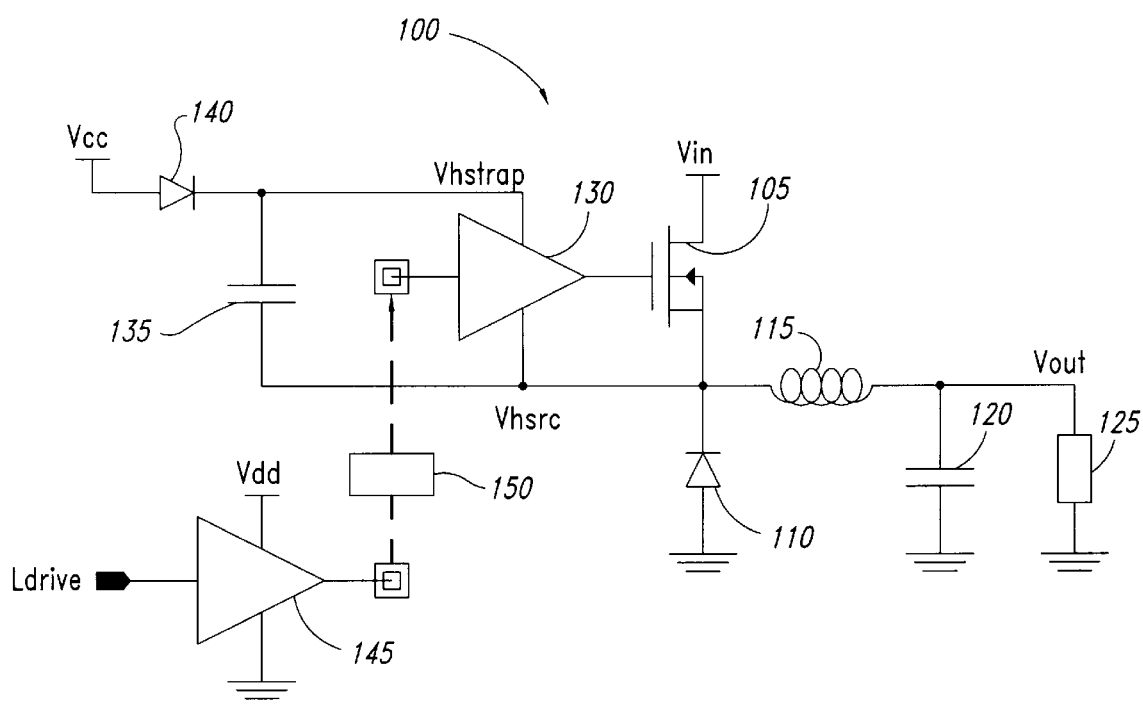
FIG. 1 shows schematically a switching system in which the translation circuit of the present invention can be used.
Figure 2A:
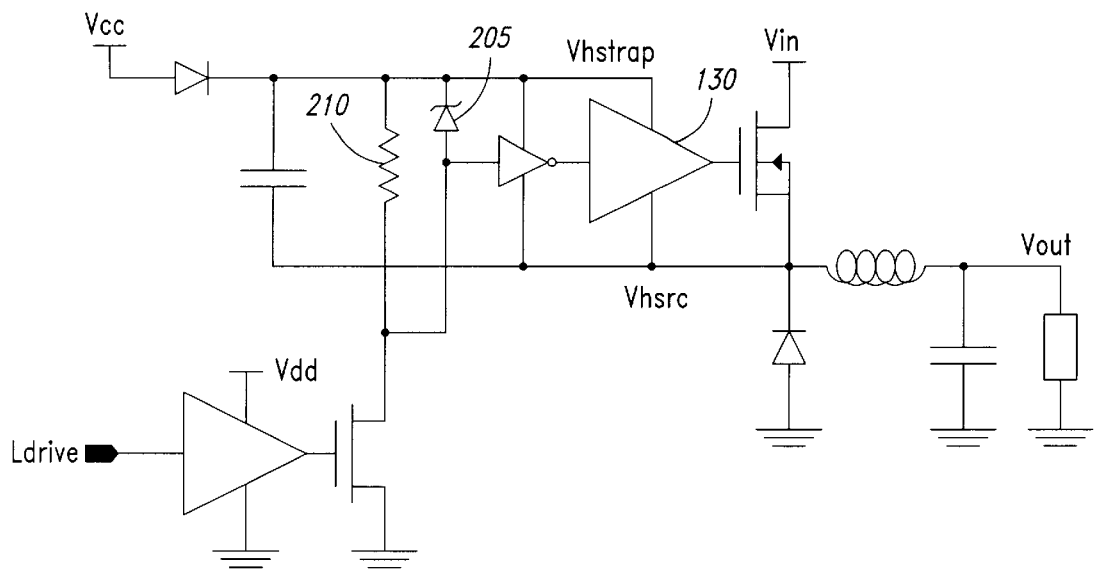
FIGS. 2a, 2b and 2c show schematically three switching systems comprising various translation devices of the prior art.
Figure 2B:
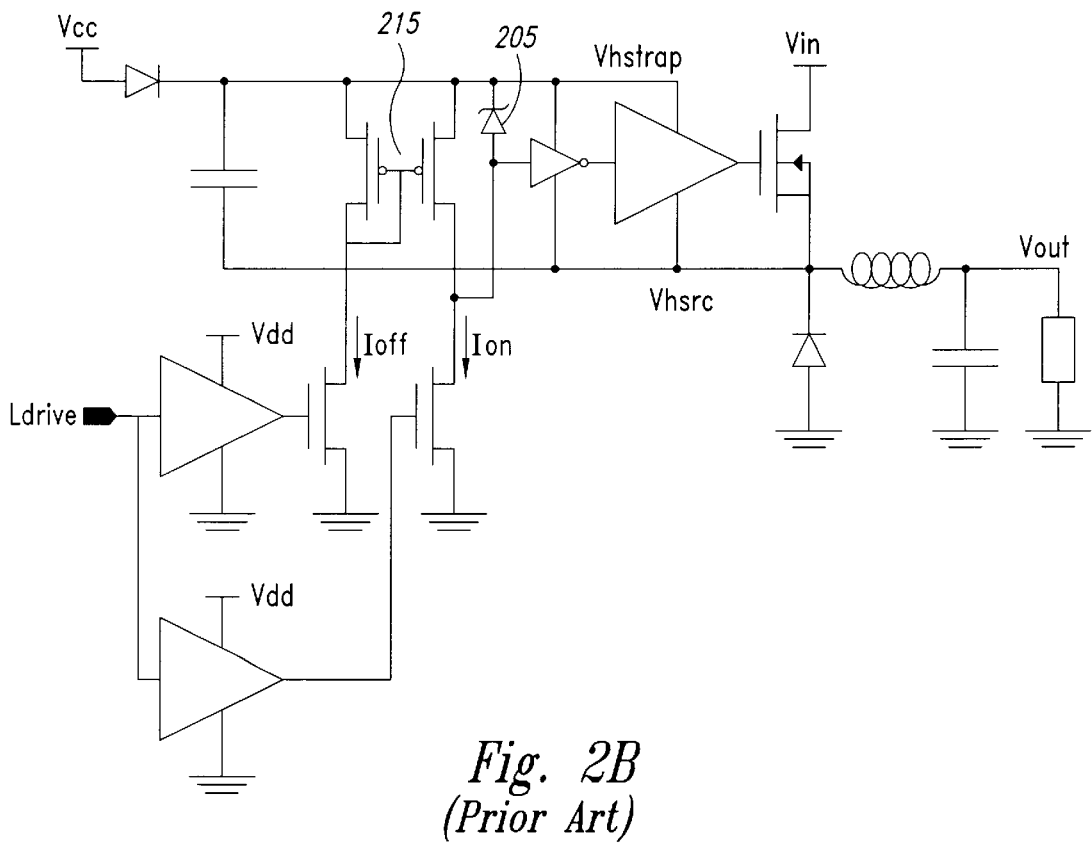
Figure 2C:
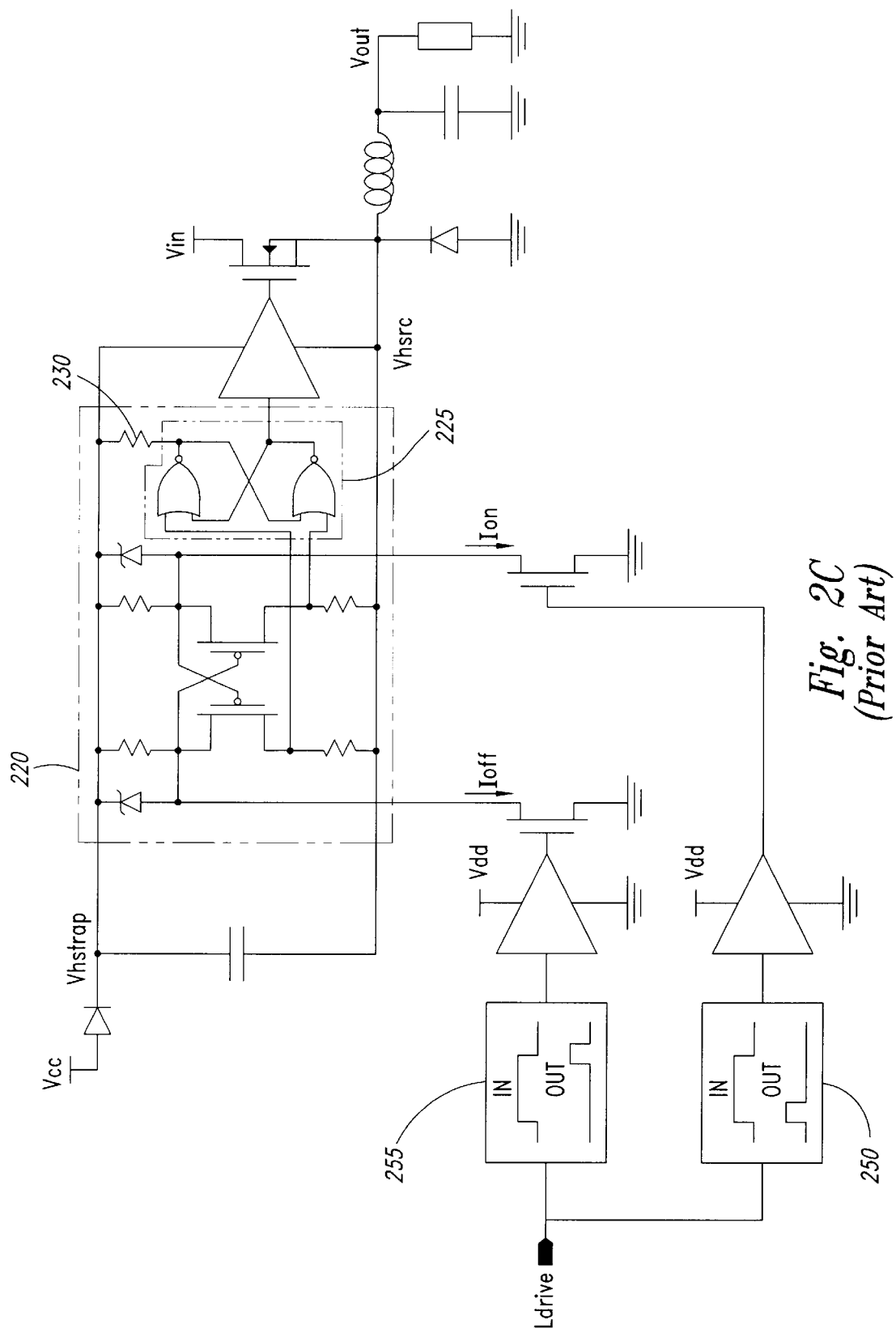
Figure 3:
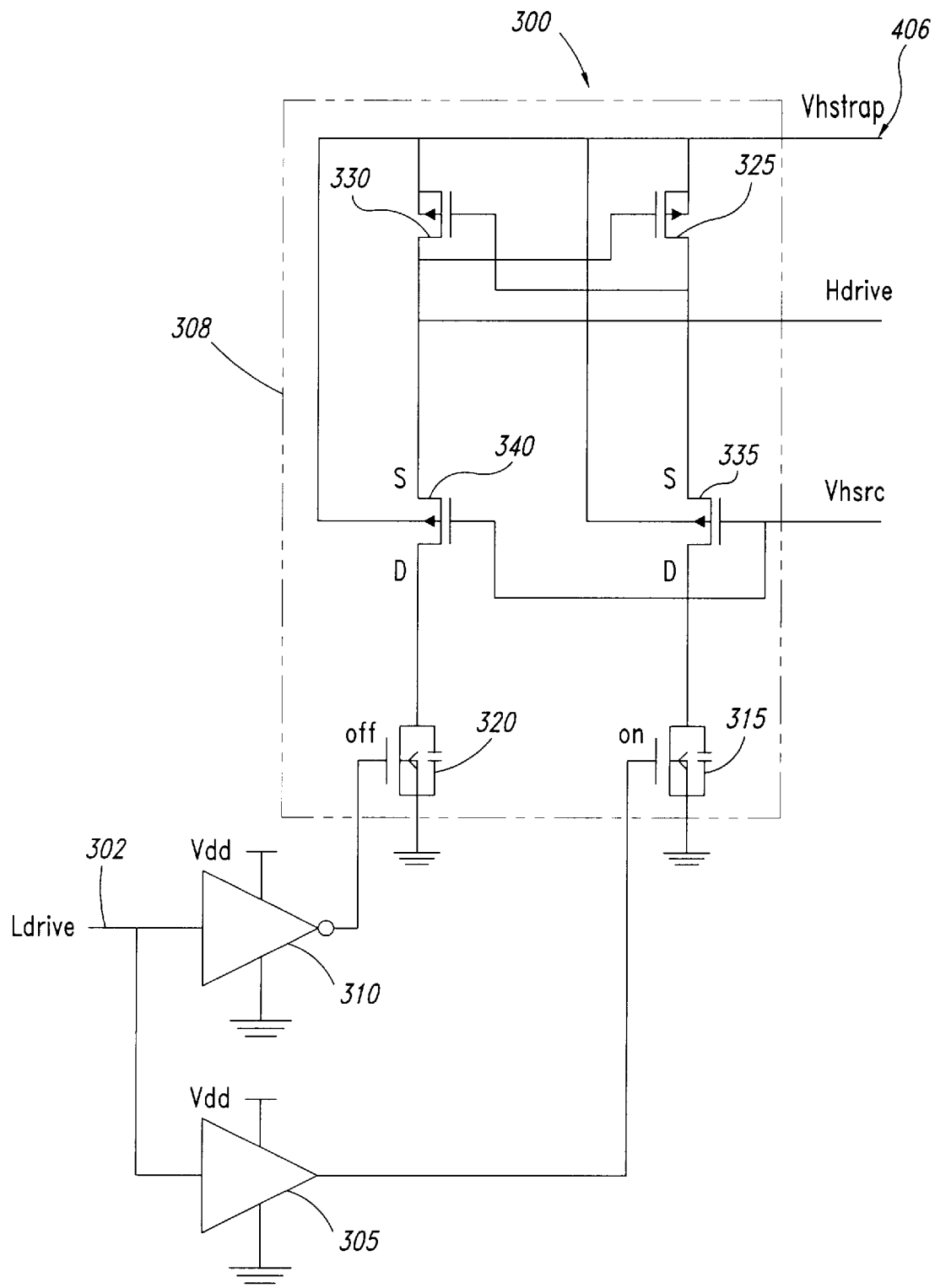
FIG. 3 shows schematically a translation circuit according to the present invention.

With reference now to the drawings and, in particular, with reference to FIG. 3 (FIGS. 1, 2a, 2b and 2c have already been described above) a first embodiment of the translation circuit according to the present invention is shown schematically.

A translation circuit 300 has four terminals for supplying voltages at the ground (0V), Vdd, Vhsrc and Vhstrap levels, respectively. The circuit 300 also has an input terminal for a switching signal Ldrive which is disposed between the first two voltage levels, that is, it can assume one or other of two values between 0V and Vdd. This switching signal Ldrive is applied to driver means constituted, in the embodiment illustrated, by a buffer 305 and by an inverter 310 (supplied between Vdd and ground) which output, respectively, a switching-on signal (on) and a switching-off signal (off) which are complementary to one another.

The two signals, that is, the switching-on signal on and the switching-off signal off, are then applied to a bistable circuit 308 constituted by two branches each comprising three transistors 315, 335, 325 and 320, 340, 330, respectively. The bistable circuit is connected to the ground (0V), Vhsrc and Vhstrap supply terminals as described in detail below.

In particular, the switching-on signal (on) is applied to the gate of the nMOS transistor 315 the source of which is connected to the ground terminal. Similarly, the switching-off signal (off) is applied to the gate of the nMOS transistor 320, the source of which is connected to the ground terminal.

The translation circuit 300 also comprises two pMOS transistors 325 and 330, the sources of which are connected to the supply terminal Vhstrap. The gate of the transistor 325 is connected to the drain of the transistor 330 and the gate of the transistor 330 is connected to the drain of the transistor 325. The translation circuit 300 has an output for the translated switching signal Hdrive connected to the drain of the transistor 330. Clearly, this translated switching signal Hdrive can also be derived from the drain of the transistor 325 by means of an inverter supplied between Vhsrc and Vhstrap. Alternatively, it is possible to obtain two separate outputs, one for a translated switching-on signal hon (obtained from the drain of the transistor 330) and one for a translated switching-off signal hoff (obtained from the drain of the transistor 325). The translated switching signal Hdrive is disposed between the voltage levels Vhsrc and Vhstrap. In this embodiment, it can assume the value Vhstrap or a value close to Vhsrc.

Two further respective pMOS transistors 335 and 340 are connected between the two nMOS transistors 315 and 320 and the two pMOS transistors 325 and 330. As shown in the drawing, the drain D of the transistor 335 is connected to the drain of the transistor 315 and the source S of the transistor 335 is connected to the drain of the transistor 325. Similarly, the drain D and the source S of the transistor 340 are connected to the drain of the transistor 320 and to the drain of the transistor 330, respectively. The gate terminals of both of the transistors 335 and 340 are connected to the supply terminal Vhsrc.

The transistors 315, 320, 335 and 340 have structures which are resistant to high voltages since their drains undergo voltage swings from 0V to Vhstrap. For example, the drains of the transistors 315 and 335 are at a voltage of 0V when the transistor 315 is conducting whereas they are at the Vhstrap voltage when the transistors 325 and 335 are conducting. In particular, the two pMOS transistors 335 and 340 operate as voltage translators preventing the voltages at the gate electrodes of the transistors 325 and 330 from assuming values such as to cause breakdown of the gate oxide.

In order to describe the operation of the circuit, an initial condition in which the transistors 320, 325 and 335 are on whilst the transistors 315, 330 and 340 are off will be considered. It is now assumed that the switching signal Ldrive adopts the value on. This value generates an on signal equal to Vdd via the buffer 305 whereas the off signal produced by the inverter 310 is zero (0V).

The transistor 315 is thus switched on whilst the transistor 320 is switched off. The voltage at the drain of the pMOS transistor 335 thus falls to zero, bringing this transistor 335 close to being switched off, that is, with a voltage between gate and source close to the threshold voltage. The voltage at the gate of the pMOS transistor 330 consequently falls to the voltage Vhsrc (plus the threshold voltage of the transistor 335) so that the pMOS transistor 330 becomes conductive. At the same time, the switching-on of the transistor 330 causes the voltage of the terminal Hdrive to rise to values close to the voltage level Vhstrap.

The source terminal of the pMOS transistor 340 is also charged to the voltage Vhstrap so that the transistor 340 is switched on. At the same time, the gate of the pMOS transistor 325 is brought to the voltage Vhstrap so that the transistor 325 is switched off.

During the switching-off stage, the operation of the translation circuit 300 is equivalent to that described above for the switching-on stage. In particular, the voltage at the terminal Hdrive assumes a value which, if the threshold voltage of the transistor 340 is ignored, is equal to the voltage Vhsrc.

The circuit 300 has no active low-impedance path between the supply terminal Vhstrap and ground. The circuit according to the present invention therefore has a static consumption that is, upon completion of the switching, practically zero.

Moreover, with the solution proposed there is no risk of loss of congruence between the logic input signal Ldrive and the translated output signal Hdrive since the translation takes place throughout the duration of the switching signal Ldrive and not only in relation to the leading or trailing edge.

Although the substrate terminals (bulk gates) of the transistors 335 and 340 may, generally, be connected to the respective sources, in the embodiment shown in FIG. 3, both of these terminals are connected to the supply terminal 406 (Vhstrap). In fact, owing to capacitive coupling, it is possible that the voltage at the source of one of these transistors 335, 340 may temporarily fall below the value of its drain voltage. The measure of the connection of the bulk gates to the supply terminal Vhstrap and not to the source of the same transistor ensures that the substrate voltage of the transistors 335, 340 cannot fall to a value below that of its own drain, thus reducing the risk of damage to the component.

An embodiment of the translation circuit according to the present invention is now described with reference to FIG. 4, where the components in common with the circuit of FIG. 3 are indicated by the same reference numerals. The translation circuit 400 comprises, as described with reference to FIG. 3, the two nMOS transistors 315 and 320, to the gates of which the switching-on signal on and the switching-off signal off derived from the switching signal Ldrive by means of a buffer and an inverter (not shown in FIG. 4, but shown in FIG. 3) are applied, respectively. The further pMOS transistors 325, 330, 335 and 340 are connected as described above with reference to FIG. 3. The voltage at the drain of the transistor 330 does not form the final translated switching-on signal hon. Instead, the output taken from the drain of the transistor 330 is connected to the gate of a pMOS transistor 405, and the output taken from the drain of the transistor 325 is connected to the gate of a pMOS transistor 410. The sources of both of the pMOS transistors 405 and 410 are connected to the supply terminal 406 (Vhstrap).

The drains of the two transistors 405 and 410 are connected to the drains of an nMOS transistor 415 and of an nMOS transistor 420, respectively. The gate of the transistor 415 is connected to the drain of the transistor 420 and the gate of the transistor 420 is connected to the drain of the transistor 415. The sources of both of the transistors 415 and 420 are connected to the supply terminal 408 (Vhsrc). The output constituted by the drain of the transistor 420 provides the translated switching-on signal hon, and the output constituted by the drain of the transistor 415 provides the translated switching-off signal hoff.

The component constituted by the transistors 405, 410, 415, 420 operates as a further voltage translator enabling the translated switching signal Hdrive to reach the value Vhsrc, eliminating the difference due to the threshold voltages of the transistors 335 and 340.

The translation circuit 400 also comprises two further pMOS transistors 425 and 430. The sources of both of the transistors 425 and 430 are connected to the supply terminal Vhstrap. The drain of the pMOS transistor 425 is connected to the drain of the transistor 335 and the drain of the pMOS transistor 430 is connected to the drain of the transistor 340. The two transistors 425 and 430 have structures which are resistant to high voltages since their drains (as explained above with reference to the transistors 315, 320, 335 and 340) undergo voltage swings of from 0V to Vhstrap.

The gate terminals of both of the transistors 425 and 430 are normally kept at a voltage Vhstrap so that both of the pMOS transistors are off. The transistor 430 is controlled at its own gate by means of a voltage pulse pon of amplitude Vhstrap-Vhsrc generated upon the transition of the translated switching signal hdrive from the translated off value hoff to the translated on value hon. Similarly, the gate of the transistor 425 is controlled by a voltage pulse poff of amplitude Vhstrap-Vhsrc generated upon the transition of the signal hdrive from the value hon to the value hoff. The duration of these voltage pulses pon and poff is typically no longer than 400 ns, for example, one hundred ns.

The two transistors 425 and 430 improve the operation of the translation circuit, reducing the switching time. With reference, for example, to the transistor 430 (similar considerations apply to the transistor 425), it is connected to the drains of the two transistors 320 and 340. As indicated above, these transistors 320, 340 have structures which are resistant to high voltages and consequently have high stray capacitances. These stray capacitances would be charged during the switching stage only by the current supplied by the pMOS transistor 330 which does not reach excessively high values (since the pMOS transistor 330 is of limited dimensions). The use of the further transistor 430 however enables these stray capacitances to be charged rapidly, thus making the switching quicker.

Figure 4:
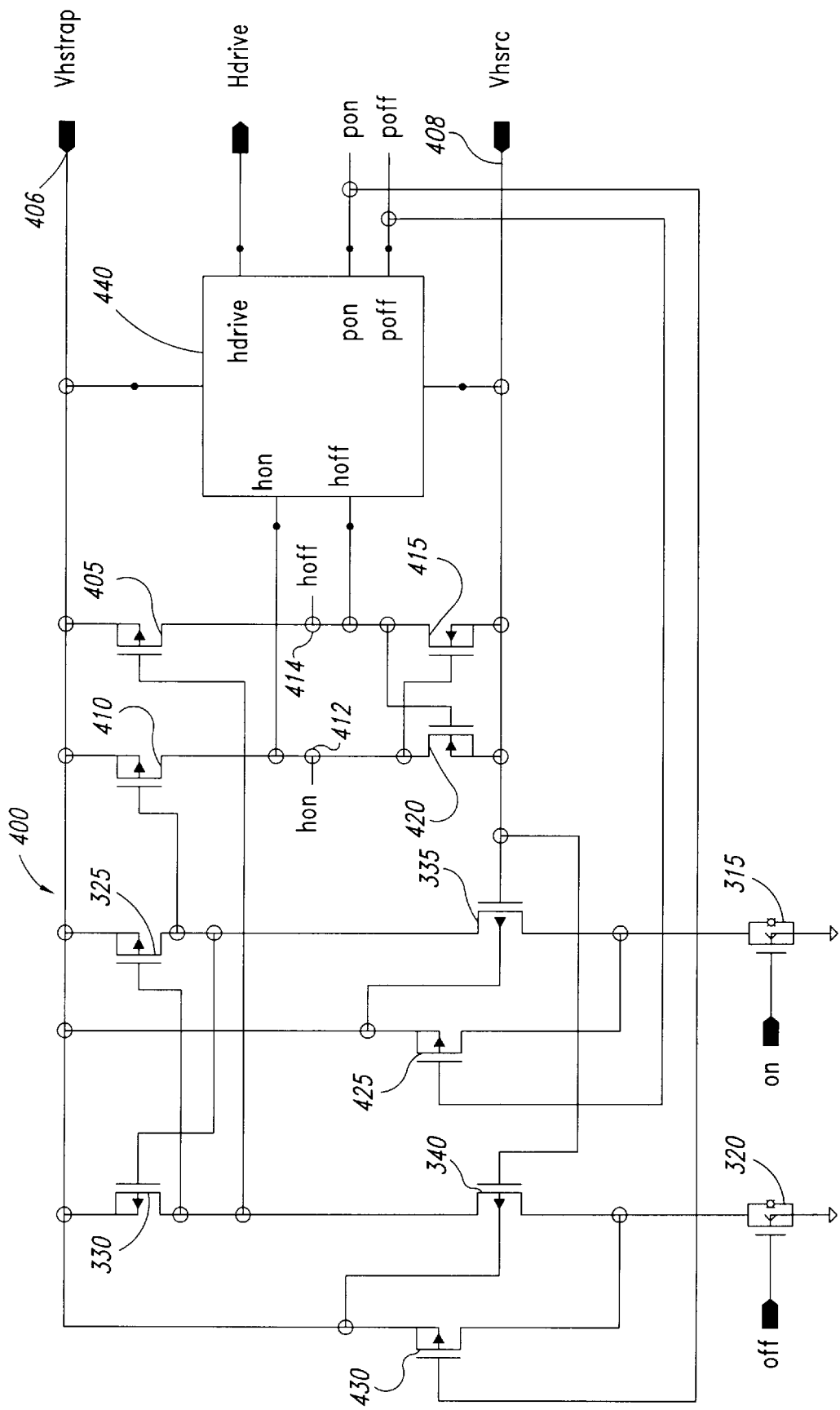
FIG. 4 shows a preferred embodiment of the translation circuit according to the present invention.

The circuit of FIG. 4 also comprises a logic element 440 supplied between Vhsrc and Vhstrap. This logic element 440 receives as inputs the translated switching-on signal hon and the translated switching-off signal hoff and outputs the voltage pulse pon for controlling the gate of the transistor 430 and the voltage pulse poff for controlling the gate of the transistor 425. In addition, the logic element 440 outputs the translated switching signal Hdrive.

In order to describe the operation of the circuit, an initial condition in which the transistors 320, 325, 335, 405 and 420 are on whilst the transistors 315, 330, 340, 410, 415, 425 and 430 are off will be considered. It is also assumed that the switching-on signal adopts the value Vdd and the switching-off signal is thus zero (0V).

During this switching-on stage, the transistor 315 is switched on whilst the transistor 320 is switched off. The pMOS transistor 335 is brought close to being switched off, that is, with a voltage between source and gate close to the threshold voltage. The transistors 330 and 410 consequently become conductive. At the same time, the switching-on of the transistor 410 causes the voltage hon at the node 412 to rise to values close to the voltage Vhstrap.

This transition of the node 412 is detected by the logic element 440 which generates a translated switching signal Hdrive, allowing the switch (not shown in FIG. 4) to be switched on.

At the same time, the logic element 440 generates the voltage pulse pon (of amplitude Vhsrc). This pulse enables the pMOS transistor 430 to be switched on for a limited time interval starting from the start of the switching so as to charge the drains of the transistors 320 and 340 to the voltage Vhstrap. The pMOS transistor 340 therefore becomes conductive.

The voltage Vhstrap at the source of the pMOS transistor 340 is applied to the gates of the pMOS transistors 325 and 405 which are therefore switched off.

The voltage Vhstrap brought by the transistor 410 (which is conductive) to the gate of the nMOS transistor 415 switches it on, bringing the node 414 (hoff) to the voltage Vhsrc. This voltage Vhsrc is also applied to the gate of the nMOS transistor 420 which is therefore switched off, completing the translation and storage of the information relating to the switching signal Ldrive.

Moreover, as a result of the switching of the signal Hdrive, the logic element 440 temporarily blocks the propagation of the signals hon and hoff towards the output of the translated switching signal Hdrive. The duration of this masking is typically no longer than 100 ns, for example 50 ns.

This measure prevents voltage variations at the nodes 412, 414 (voltages hon or hoff), due to the switching of the structure, from generating spurious transitions which could cause the switch (not shown in FIG. 4) to switch off early.

During the switching-off stage, the operation of the translation circuit is equivalent to that described above for the switching-on stage. In particular, the transition of the node 414 (voltage hoff) from Vhsrc to Vhstrap, detected by the logic component 440, generates the signal Hdrive which is equal to zero and causes the switch (not shown in FIG. 4) to be switched off.

Figure 5:
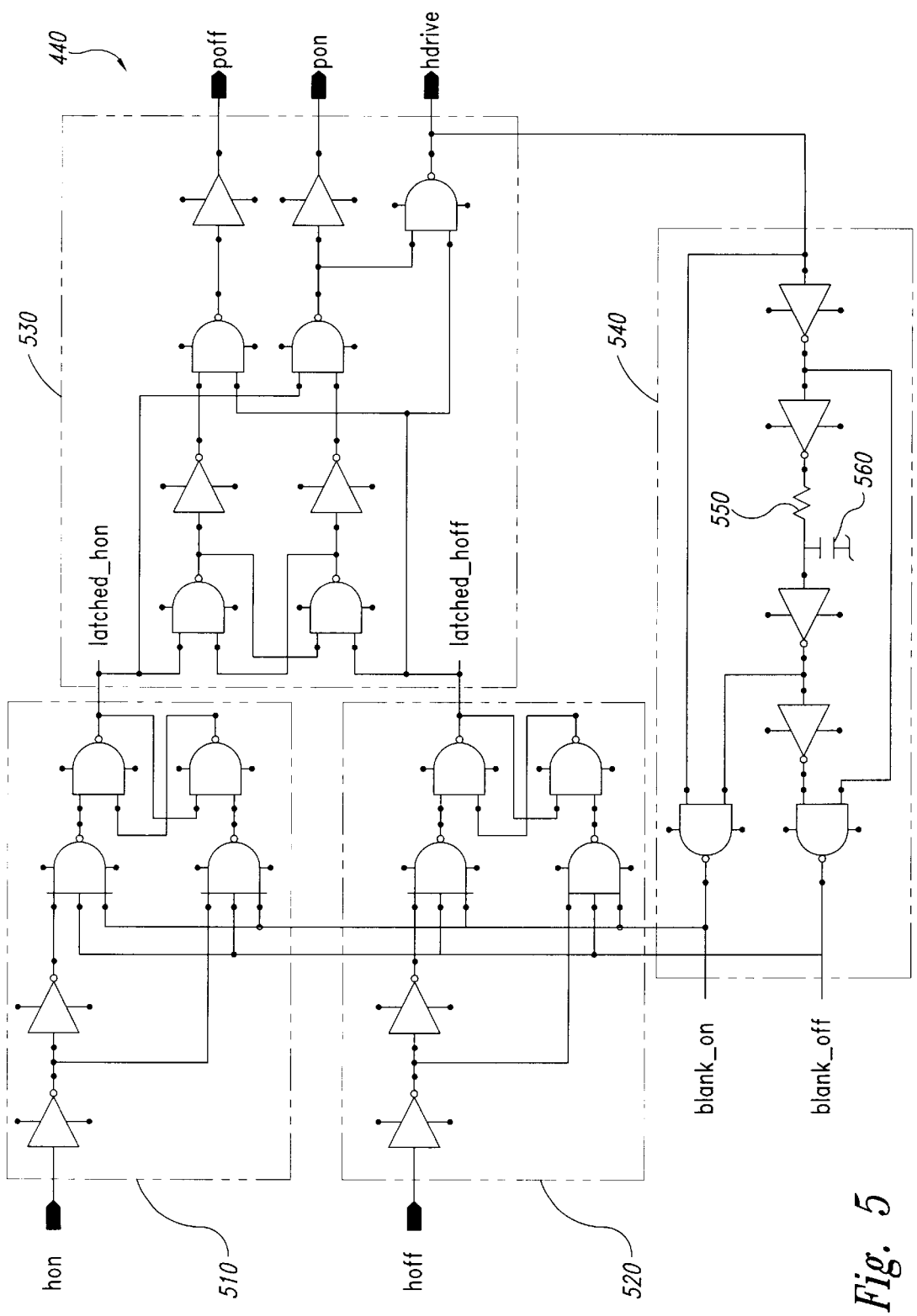
FIG. 5 shows the structure of the logic element of FIG. 4.

An embodiment of the logic element 440 of FIG. 4 will now be described with reference to FIG. 5. The logic element 440 includes a block 510 that is a memory (latch) component. The memory component stores the value of the translated switching-on signal hon as a latched translated switching-on signal latched_hon, enabling the spurious transitions of hon at the node 412 (FIG. 4) to be masked during the switching of the system. Similarly, the block 520 stores the translated switching-off signal hoff as a latched translated switching-off signal latched_hoff in order to mask the spurious transitions of hoff at the node 414.

The logic component 440 then comprises a sequential network 530 which can generate the translated switching signal Hdrive, detecting the transitions of hon and hoff from Vhsrc to Vhstrap. This sequential network 530 also generates (as described in detail below) the pulsed logic signals pon and poff upon the transitions of the translated switching signal Hdrive in order to pilot the transistors 430 and 425, respectively.

The RC circuit 540, on the other hand, produces two masking signals blank_on and blank_off upon the switching of the signal Hdrive. The duration of these masking signals is fixed by the time constant RC defined by the resistor 550 and the capacitor 560 (for example 50 ns). The masking signals blank_on and blank_off are applied, respectively, to the memory components 510 and 520 so as to block the propagation both of the signal hon and of the signal hoff.

The durations of the voltage pulses pon and poff are defined by the durations of the masking pulses blank_on and blank_off and by the duration of the switching of the signals hon and hoff. For example, it is assumed that the signal hon switches from Vhsrc to Vhstrap with the consequent generation of the voltage pulse pon. This voltage pulse pon is maintained as long as the masking pulses blank_on and blank_off are active or the signal hoff has a value Vhstrap (that until it is switched to the value Vhsrc). If the switching of the signal hoff at the node 414 terminates before the masking pulses blank_on/blank_off, the duration of the signal pon will be equal to that of these pulses (for example 50 ns). If, on the other hand, the switching of the signal hoff at the node 414 terminates afterwards, the voltage pulse pon will have a longer duration (for example 300 ns).

Persons skilled in the art will appreciate that the foregoing description can also be applied with the nMOS transistors replaced by pMOS transistors and vice versa. Similar considerations also apply if some of the MOS transistors are replaced by suitable bipolar NPN and PNP transistors, the gate, source and drain terminals being replaced by the appropriate base, emitter and collector terminals.

Figure 6:
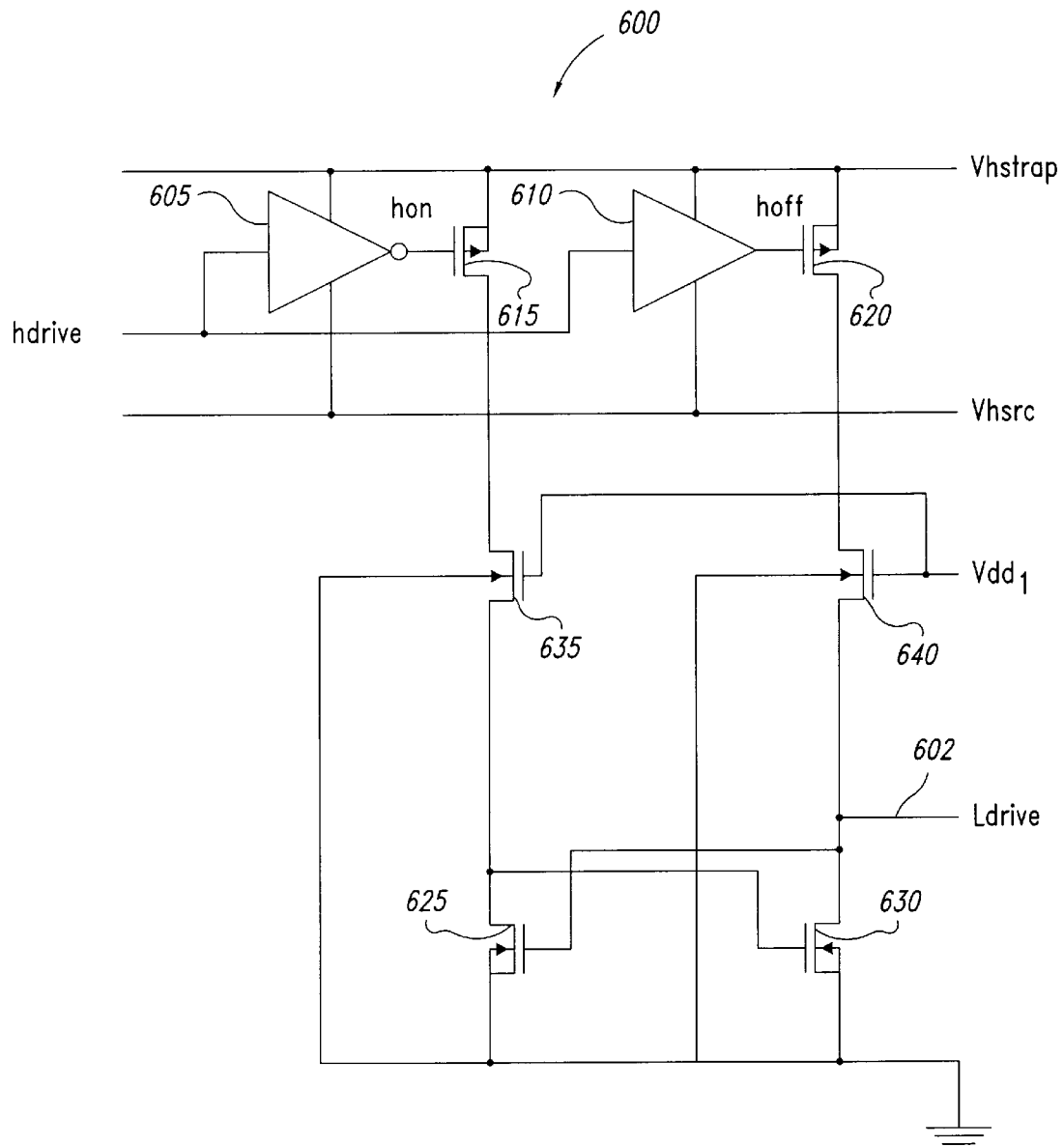
FIG. 6 shows schematically a translation circuit complementary to that of FIG. 3.

One translation circuit complementary to that of FIG. 3 is shown schematically, for example, with reference to FIG. 6. The translator circuit 600 has an input terminal for the switching signal hdrive disposed between Vhsrc and Vhstrap (where Vhsrc may even assume very high values, for example 100 V) and an output terminal 602 for a corresponding switching signal Ldrive between 0V and Vdd (for example 5V). The switching signal hdrive is applied to an inverter 605 and to a buffer 610 (supplied between Vhsrc and Vhstrap) which output, respectively, the switching-on signal hon and a switching-off signal hoff which are complementary to one another. The switching-on signal hon and the switching-off signal hoff are applied, respectively, to the gates of a pMOS transistor 615 and of a pMOS transistor 620, the sources of which are connected to the supply terminal Vhstrap.

The translation circuit 600 then comprises two nMOS transistors 625 and 630, the sources of which are connected to the ground terminal (0V). The gate of the transistor 625 is connected to the drain of the transistor 630 and the gate of the transistor 630 is connected to the drain of the transistor 625. The output 602 for the switching signal Ldrive is connected to the drain of the transistor 630.

Two further nMOS transistors 635 and 640 are connected between the two respective pMOS transistors 615 and 620 and the two nMOS transistors 625 and 630. The gate terminals and the substrate terminals (bulk gates) of both of the transistors 635 and 640 are connected, respectively, to the supply terminal Vdd and to the ground terminal (0V). The transistors 615, 620, 635 and 640 have structures which are resistant to high voltages since their drains undergo voltage swings from Vhstrap to 0V.

The operation of the circuit 600 is complementary to that of the circuit 300 shown in FIG. 3. In particular, it should be noted that the switching-on signal hon and the switching-off signal hoff are active at the low value Vhsrc. Similar considerations apply to the production of a circuit complementary to that shown in FIG. 4.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A circuit for translating a switching signal disposed between a first voltage level and a second voltage level to a corresponding translated switching signal disposed between a third voltage level and a fourth voltage level, the circuit comprising:

a first terminal, a second terminal, a third terminal and a fourth terminal for supplying voltages at the first, second, third and fourth levels;

driver means connected to the first and second supply terminals in order to derive, from the switching signal applied to an input terminal of the driver means, a switching-on signal and a switching-off signal at a first output terminal and at a second output terminal, respectively; and a bistable circuit connected to the first, third and fourth supply terminals, and including a first branch and a second branch, the branches including, respectively, a first transistor and a second transistor of a first type, each of the first and second transistors having a first terminal connected to the first supply terminal, a second terminal and a control terminal connected, respectively, to the first and second output terminals of the driver means, the bistable circuit comprising a first output for a translated switching-on signal and a second output for a translated switching-off signal constituted by the second terminals of the fourth and third transistors, respectively, and being responsive to produce the translated switching signal at at least one output terminal thereof;

wherein the first and second branches include, respectively:

a third transistor and a fourth transistor of a second type complementary to the first type, and each having a first terminal, a second terminal and a control terminal, the first terminals of both being connected to the fourth supply terminal, the second terminal of each of them being connected to the control terminal of the other; and a fifth transistor and a sixth transistor of the second type, connected between the respective second terminals of the first and second transistors and the respective second terminals of the third and fourth transistors and each having its control terminal connected to the third supply terminal, the second terminal of the third or fourth transistor being the said at least one output terminal of the bistable circuit a further voltage translator circuit having a first input and a second input connected, respectively, to the first and second outputs of the bistable circuit and at least one output for the translated switching signal, the further voltage translator circuit comprising a seventh transistor and an eighth transistor of the second type, both having a first terminal connected to the fourth supply terminal, the control terminals of the seventh and eighth transistors being the first and second inputs of the further voltage translator circuit, respectively;

a ninth transistor and a tenth transistor of the first type, both having a first terminal connected to the third supply terminal, a second terminal of each of them being connected to the control terminal of the other and to the second terminal of the seventh or eighth transistor, respectively, the second terminals of the ninth and tenth transistors being the said at least one output terminal of the further voltage translator circuit.

2. A translator circuit according to claim 1 in which the further voltage translator circuit comprises a first output for the translated switching-on signal and a second output for the translated switching-off signal, constituted by the second terminals of the tenth and ninth transistors, respectively.

3. A translator circuit according to claim 2, further comprising:

logic means having a first input and a second input connected, respectively, to the first and second outputs of the bistable circuit or of the further translator circuit, and a first output and a second output, and being able to generate at the first output a first voltage pulse upon the transition of the translated switching signal from a translated switching-off value to a translated switching-on value and, at the second output, a second voltage pulse upon the transition of the translated switching signal from the translated switching-on value to the translated switching-off value; and an eleventh transistor and a twelfth transistor of the second type, each having a first terminal connected to the fourth supply terminal, second terminals of the eleventh and twelfth transistors being connected to the first terminals of the fifth and sixth transistors, respectively, the control terminals of the eleventh and twelfth transistors being connected, respectively, to the second and first outputs of the logic means.

4. A translator circuit according to claim 3, in which the logic means comprise:

a third output for the translated switching signal; and means for temporarily blocking the propagation of the translated switching-on signal and of the translated switching-off signal upon a switching of the translated switching signal.

5. A translator circuit according to claim 4, in which the logic means comprise:

a first memory circuit for storing the translated switching-on signal and a second memory circuit for storing the translated switching-off signal;

a sequential circuit connected to the first and second memory circuits to generate the translated switching signal and the first and second voltage pulses; and an RC circuit connected to the translated switching signal to generate a first masking pulse for blocking the propagation of the translated switching-on signal and a second masking pulse for blocking the propagation of the translated switching-off signal, the first masking signal being applied to the first memory circuit and the second masking signal being applied to the second memory circuit.

6. A translator circuit according to claim 5, in which the transistors of the first type are N-channel field-effect transistors and the transistors of the second type are P-channel field-effect transistors, the first terminals of the transistors being the drains, the second terminals being the sources and the control terminals being the gates.

7. A translator circuit according to claim 6, in which each of the fifth and sixth transistors has a substrate terminal connected to the fourth supply terminal.

8. A switching system, comprising:
a translator circuit for translating a switching signal disposed between a first voltage level and a second voltage level to a corresponding translated switching signal disposed between a third voltage level and a fourth voltage level, the circuit comprising:
a first terminal, a second terminal, a third terminal and a fourth terminal for supplying voltages at the first, second, third and fourth levels;
driver means connected to the first and second supply terminals in order to derive, from the switching signal applied to an input terminal of the driver means, a switching-on signal and a switching-off signal at a first output terminal and at a second output terminal, respectively;
a bistable circuit connected to the first, third and fourth supply terminals, and including a first branch and a second branch, the branches including, respectively, a first transistor and a second transistor of a first type, each of the first and second transistors having a first terminal connected to the first supply terminal, a second terminal, and a control terminal connected, respectively, to the first and second output terminals of the driver means, the bistable circuit being responsive to produce the translated switching signal at at least one output terminal thereof;
wherein the first and second branches include, respectively:
a third transistor and a fourth transistor of a second type complementary to the first type, and each having a first terminal, a second terminal and a control terminal, the first terminals of both being connected to the fourth supply terminal, the second terminal of each of them being connected to the control terminal of the other; and
a fifth transistor and a sixth transistor of the second type, connected between the respective second terminals of the first and second transistors and the respective second terminals of the third and fourth transistors and each having its control terminal connected to the third supply terminal, the second terminal of the third or fourth transistor being the said at least one output terminal of the bistable circuit;
an electronic switch having first and second terminals, one of the first and second terminals being connected to the third supply terminal the other of the first and second terminals being connected to a fifth voltage supply terminal; and
a driver connected to the third and fourth supply terminals, to the translator circuit and to a control terminal of the electronic switch in order to receive the translated switching signal as an input and to output a signal for opening and closing the electronic switch.

9. A level translator circuit for translating an input signal from a first voltage range between a first supply voltage and a first reference voltage to a translated voltage in a second voltage range between a second supply voltage and a second reference voltage in response to a switching signal in the first voltage range, comprising:

an input terminal for receiving the switching signal;
a first circuit leg extending between the second supply voltage and the first reference voltage, the first circuit leg comprising:
a first enabling switch coupled between the first reference voltage and a first circuit node, the first enabling switch having a control terminal selectively coupled to the first supply voltage in response to the switching signal to couple the first circuit node to the first reference voltage;
a first control switch having a first input coupled to the second supply voltage, a first switching input, and a first control output, the first control switch being responsive to couple the second supply voltage to the first control output in response to a selected first signal at the first switching input;
a first level shifter including a first reference terminal coupled to the first circuit node, a first output terminal coupled to the first control output, and a first control terminal coupled to the second reference voltage, the first level shifter being responsive to produce a first output voltage substantially equal to the second reference voltage at the first output terminal in response to the first circuit node being coupled to the first reference voltage and the first output terminal being isolated from the second supply voltage, the first level shifter further being responsive to isolate the first output terminal from the first circuit node in response to the first output terminal being coupled to the second supply voltage;
a second circuit leg extending between the second supply voltage and the second reference voltage, the second circuit leg including:
a second enabling switch coupled between the first reference voltage and a second circuit node, the second enabling switch having a control terminal selectively coupled to the first supply voltage in response to the switching signal to couple the second circuit node to the first reference voltage;
a second control switch having an input coupled to the second supply voltage, a switching input, and a second control output, the second control switch being responsive to a selected second signal at the switching input to couple the first supply voltage to the second control output; and
a second level shifter including a second reference terminal coupled to the second circuit node, a second output terminal coupled to the second control output, and a second control terminal coupled to the second reference voltage, the second level shifter being responsive to produce a second output voltage substantially equal to the second reference voltage at the second output terminal in response to the second circuit node being coupled to the first reference voltage and the second output terminal being isolated from the second supply voltage, the second level shifter further being responsive to isolate the second output terminal from the second circuit node in response to the second output terminal being coupled to the second supply voltage; and
a logic circuit coupled to one of the first and second output terminals and to the third voltage source and responsive to produce a pulsed output signal in response to the voltage of the one of the first and second output terminals.

10. The level translator circuit of claim 9 wherein the first level shifter is a first transistor.

11. The level translator circuit of claim 10 wherein the first transistor is a metal oxide semiconductor (MOS) transistor and wherein the gate of the first transistor forms the first control terminal, the drain of the first transistor forms the first reference terminal and the source of the first transistor forms the first output terminal.

12. The level translator circuit of claim 11 wherein the transistor includes a body and wherein the body is coupled to the second supply voltage.

13. The level translator circuit of claim 9, further including an inverting circuit coupled between the input terminal and the first or second enabling switch and operative to provide an inverted switching signal to the first or second enabling switch.

14. The level translator circuit of claim 9 wherein the first and second level shifters are metal oxide semiconductor (MOS) transistors having respective threshold voltages, and wherein the first and second level shifters have gates that form the first and second control terminals of the first and second level shifters, respectively, the first and second level shifters have drains that form the first and second reference terminals, and the first and second level shifters have sources that form the first and second output terminals, the circuit further including a threshold adjustment circuit having an adjustment input coupled to the first or second output terminal and an adjusted output terminal, the threshold adjustment circuit being operative to shift the voltage at the first or second output terminal by substantially the threshold voltage of the first or second transistor.

15. The level translator circuit of claim 14, further including a masking circuit having an input coupled to receive the pulsed output signal and responsive to inhibit switching of the first leg during a selected period in response to the pulsed output signal.

16. A circuit for translating a switching-on signal and a switching-off signal between a first voltage level and a second voltage level, respectively, to a corresponding translated switching signal disposed between a third voltage level and a fourth voltage level, the circuit comprising:

a first voltage translator circuit connected to the first, second, third, and fourth voltage levels and being responsive to the switching-on signal and switching-off signal to produce a translated switching-on signal at a first output and a translated switching-off signal at a second output;

a second voltage translator circuit connected to the third and fourth voltage levels and having a first input and a second input connected, respectively, to the first and second outputs of the first voltage translator circuit and at least one output for the translated switching signal a logic circuit coupled to the first or second output and responsive to produce a pulsed output signal in response to the voltage of the first or second output terminals; and a masking circuit having an input coupled to receive the pulsed output signal and responsive to mask switching of the first voltage translator circuit during a selected period in response to the pulsed output signal.

17. A switching system, comprising:

a first voltage translator circuit connected to first, second, third, and fourth voltage level supply terminals and being responsive to a first voltage level switching-on signal at a first input and a second voltage level switching-off signal at a second input to produce a third voltage level switching-on signal at a first output and a fourth voltage level switching-off signal at a second output;

a second voltage translator circuit connected to the third and fourth voltage level supply terminals and being responsive to the first voltage translator circuit for producing a translated switching signal, the second voltage translator circuit having a first input and a second input connected, respectively, to the first and second outputs of the first voltage translator circuit and at least one output for the translated switching signal;

an electronic switch having first and second terminals and a control terminal, one of the first and second terminals being connected to the third voltage level supply terminal the other of the first and second terminals connected to a fifth voltage level supply terminal; and a driver connected to the third and fourth voltage level supply terminals, to the second voltage translator circuit, and to the control terminal of the electronic switch in order to receive the translated switching signal as an input and to output a signal for opening and closing the electronic switch.

* * * * *